United States Patent [19]
Wilson et al.

[11] Patent Number: 5,220,565
[45] Date of Patent: Jun. 15, 1993

[54] SELECTIVE TRANSMISSION OF ENCODED VOICE INFORMATION REPRESENTING SILENCE

[75] Inventors: Alan L. Wilson, Hoffman Estates; Christopher P. Moreno, Elgin; Donald G. Newberg, Schaumburg, all of Ill.

[73] Assignee: Motorola, Inc., Schaumburg, Ill.

[21] Appl. No.: 706,910

[22] Filed: May 30, 1991

[51] Int. Cl.$^5$ .................................. H04J 3/26
[52] U.S. Cl. ........................ 370/94.1; 370/110.1
[58] Field of Search .......... 370/94.1, 99, 110.1, 370/80, 81, 60; 455/63

[56] References Cited

U.S. PATENT DOCUMENTS

| | | | |
|---|---|---|---|
| Re. 32,789 | 11/1988 | Lynk, Jr. et al. | 379/58 |
| 3,654,555 | 4/1972 | Ryan et al. | 325/348 |
| 3,660,765 | 5/1972 | Glasser et al. | 325/478 |
| 3,899,739 | 8/1975 | Herman | 325/319 |
| 4,132,953 | 1/1979 | Martin, III | 325/478 |
| 4,344,175 | 8/1982 | Leslie | 375/5 |
| 4,630,262 | 12/1986 | Callens et al. | 370/81 |
| 4,692,945 | 9/1987 | Zdunek | 455/17 |
| 4,905,302 | 2/1990 | Childress et al. | 455/34 |
| 4,970,720 | 11/1990 | Esaki | 370/94.1 |

Primary Examiner—Douglas W. Olms
Assistant Examiner—Melvin Marcelo
Attorney, Agent, or Firm—Steven G. Parmelee

[57] ABSTRACT

Discrete packets (306) containing encoded voice information are transmitted within frames (301 and 302) in a repetitive manner until all voice information has been sent. Following transmission of all packets containing such voice information, at least a predetermined number of additional packets (401) are then transmitted, which additional packets represent silence. Following this, a disconnect signal (304) is transmitted. So configured, loss of the disconnect signal due to fading or other communication pathway disturbances will not necessarily lead to audibilization of undesired sounds, as the decoding protocol at the receiver (200) provides for reprocessing of recently received packet information in the absence of newly available reliable information. Hence, the silence information is continually reprocessed until either reliable information is again available or a time out sequence concludes.

18 Claims, 2 Drawing Sheets

SELECTIVE TRANSMISSION OF ENCODED VOICE INFORMATION REPRESENTING SILENCE

FIELD OF THE INVENTION

This invention relates generally to encoded voice transmission systems, including but not limited to radio communication systems.

BACKGROUND OF THE INVENTION

Radio communication systems, including two-way communication systems, are well known in the art. In many such systems, the communication channel (wherein the "channel" may be a dedicated frequency, a frequency or frequency pair allocated pursuant to a frequency division multiplexing scheme, one or more assigned time slots in a time division multiplex system, a code division multiplexed channel, or other radio frequency communication path) must first be allocated or otherwise established prior to or co-extensive with initial usage, and knocked down or otherwise made available following usage. In many such systems, the knock down mechanism, in addition to relinquishing the radio link, also facilitates avoidance of squelch tail audibilization at receiving radios.

In analog clear voice radio systems, carrier squelch detects, analog tones, or digital codes are utilized to avoid squelch tail noise. Similarly, digital codes serve this same function in many digitally encrypted systems. In all of these cases, upon detecting the appropriate signal, the receiving radio sequelches its audio processing, thereby avoiding or minimizing audibilization of a squelch tail.

The above described methodologies work well enough in an appropriate application. Where, however, a particular application requires the use of multiple packets of encoded voice information (such as CELP or VSELP encoded voice), such prior art approaches are not necessarily sufficient. This becomes particularly true as throughput demands increase on the one hand, and the need for rapid channel set up and knock down increases on the other.

To illustrate at least one aspect of the problem in more detail, consider the following example. In a typical voice encoded communication system, an initial voice message is appropriately processed into a corresponding plurality of information packets, wherein each packet contains digital information representing an encoded representation of a portion of the original voice message. These packets are then transmitted in serial fashion, along with some system signalling information.

The system signalling information may include, for example, an end-of-message (EOM) indicator or the like. Upon detecting an EOM at the conclusion of a message, a receiver can appropriately squelch further audio processing, in accordance with prior art technique as already noted above. Typically, however, such EOMs comprise a relatively small amount of information relative to the full message, and in a multipath fading environment (such as that presented in land mobile radio), such signalling information may well be lost from time to time.

To accommodate such a fading environment, many receivers in such a system will compensate for the lack of currently available viable packets by substituting previously received good packets. This substitution then continues until either valid information again reappears, or a time-out sequence concludes.

This arrangement functions well to assist the receiver during short fades that occur while receiving encoded voice packets. When, however, a fade coincides with the EOM signal at the conclusion of a message, considerable mischief results. In particular, the receiver, unaware that the link has been brought down, continues to monitor for additional valid voice packets. In the absence of receiving such packets, the receiver reprocesses previously received voice information, and this reprocessing continues until a time-out sequence concludes. This reprocessed information, rendered audible by the receiver during the time-out period, constitutes an objectionable squelch tail-like artifact.

One way to avoid the above problem, or to at least minimize it, would be to include significantly more control signalling into the information stream. Inclusion of such additional signalling information would render less likely a devastating coincidence between a debilitating fade and an EOM indicator. Increasing overhead signalling, however, will typically require a commensurate reduction in throughput capability for voice information, and this will usually result in a concurrent loss of voice quality.

Accordingly, a need exists for an end-of-message methodology that will not increase overhead signalling while simultaneously minimizing squelch tails and related phenomena during end-of-message processing.

SUMMARY OF THE INVENTION

This need and others are substantially met through provision of the method and apparatus disclosed herein. Pursuant to the method, a message to be transmitted is packetized to produce discrete packets. These discrete packets are then transmitted. Upon concluding such transmission, at least one additional packet representing silence is automatically transmitted.

In one embodiment of the invention, a disconnect signal is then additionally transmitted.

Pursuant to the above, the additional packet containing silence will promote a quiet audible output at the receiver prior to disconnect. More importantly, if perturbations to the radio link coincident with transmission of the disconnect signal occur, such that the disconnect instruction is lost, the receiver will typically not produce undesirable sounds, since the receiver will, in its usual operating mode, reprocess recently received voice information in the absence of new information. As provided herein, of course, such previously received information will comprise the voice packet containing silence, and hence the audible output at the receiver will be either silence or a signal having greatly reduced audible content.

In one embodiment of the invention, at least two such packets representing silence are transmitted at the conclusion of a message.

In yet another embodiment of this invention, a radio supports transmission of the additional packets representing silence.

DESCRIPTION OF A PREFERRED EMBODIMENT

Figure 1:
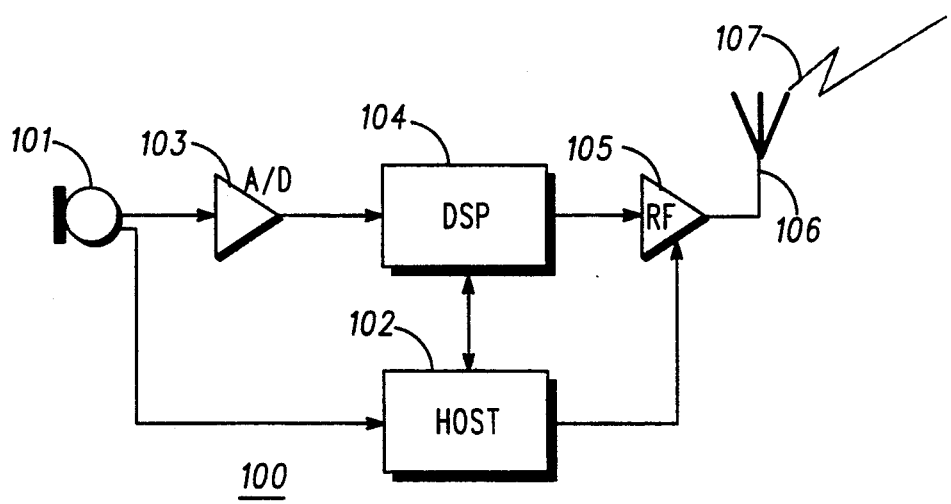
FIG. 1 comprises a block diagram of a transmitter in accordance with the invention.

A transmitter constructed in accordance with the invention appears in FIG. 1 as generally represented by the reference numeral 100. This radio transmitter (100) includes generally a microphone (101) for receiving an audible voice message to be transmitted, and for providing a push-to-talk (PTT) signal to a host computer (102) (such as an HC11 as manufactured and sold by Motorola, Inc.), the latter being in accordance with well understood prior art technique. The transduced output of the microphone (101) comprises an analog signal representing the voice input, and passes through an appropriate analog to digital convertor (103), which digitizes this information and provides the digital representation to a digital signal processor (DSP) (104) (such as a DSP56000 as manufactured and sold by Motorola, Inc.). The DSP (104) is programmed as desired to effectuate a particular voice encoding methodology, such as CELP or VSELP. In this particular embodiment, it will be presumed that the encoding methodology of choice is VSELP. (For further information regarding VSELP encoding, the interested reader is referred to U.S. Pat. No. 4,817,157 entitled "Digital Speech Coder Having Improved Vector Excitation Source", the latter being incorporated herein by this reference.)

The DSP (104) produces at its output a plurality of discrete packets, wherein each packet represents encoding information representing a portion of the original speech information. These packets are provided to an appropriate radio frequency (RF) unit (105), which uses the packet information to modulate an appropriate carrier signal, which carrier signal (107) is then radiated from an appropriate radiating element (106), all as well understood in the art.

Both the DSP (104) and the RF unit (105) are controlled, at least in part, by the host computer (102). In particular, so configured, the host computer (102) can detect conclusion of a voice message by detecting appropriate manipulation of the PTT switch on the microphone (101). In response thereto, the host computer (102) signals the DSP (104) to insert a predetermined number of additional packets representing silence into its output, as will be described below in more detail. Following transmission of these additional packets, the host computer (102) then signals the RF unit (105) to terminate transmission activity.

Figure 2:
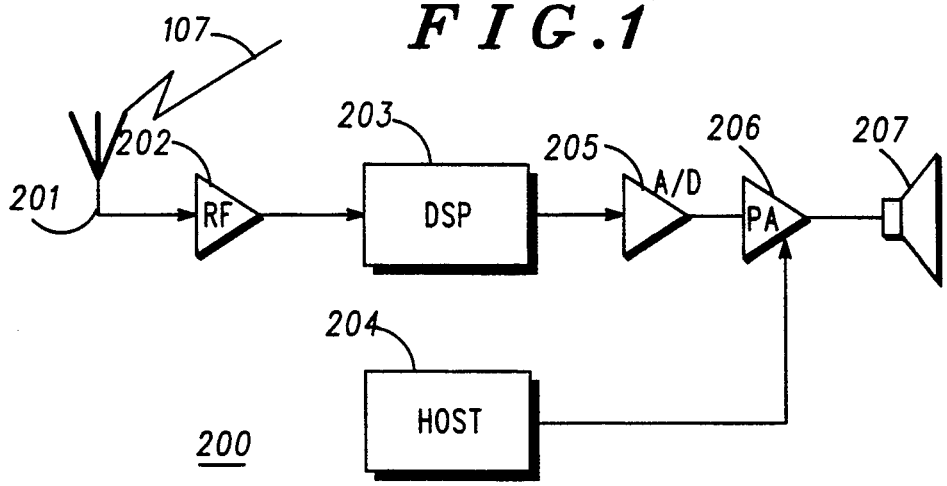
FIG. 2 comprises a block diagram of a receiver in accordance with the invention.

Referring now to FIG. 2, a receiver (200) includes an antenna (201) for receiving the carrier signal (107), and an associated RF unit (202) for receiving this signal and demodulating it to retrieve the discrete packets as sourced by the transmitter (100). These recovered packets are provided to a DSP (203) that has been appropriately programmed to reconstruct the original voice information based upon the voice packet information. As will be described in more detail, these packets have interleaved therewith signalling information pertinent to various system overhead functions and features. The DSP (203) provides the latter information to a host computer (204).

The output of the DSP (203) comprises a digitized representation of the original voice message. This output passes through an appropriate digital to analog convertor (205) and then to a power amplifier (206). The latter amplifies the reconstructed analog voice information, and a speaker (207) then renders this information audible.

The host computer (204), upon receiving a recovered disconnect signal from the DSP (203), will respond by squelching the power amplifier (206), the latter in accordance with prior art technique.

Figure 3:
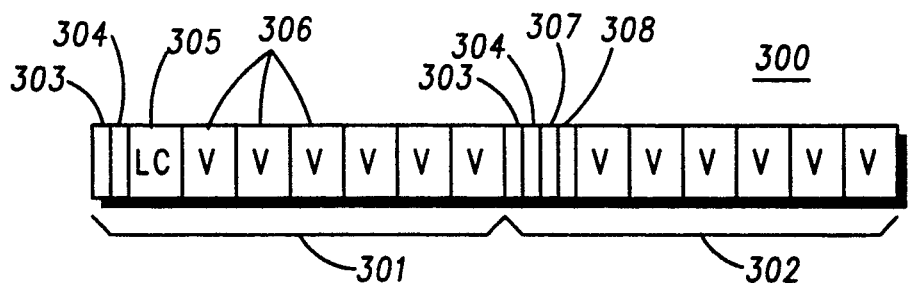
FIG. 3 comprises a depiction of a superframe in accordance with the invention.

Referring now to FIG. 3, the signalling strategy for this system will now be described. This system repetitively presents a superframe (300) (with only one such superframe being depicted in FIG. 3 for purposes of clarity). Each superframe (300) includes two frames (301 and 302). Each frame (301 and 302) includes a first packet (303) that, in this embodiment, comprises 48 bits of synchronizing pattern information. Following this, each frame (301 and 302) includes a second packet (304) that constitutes a 64 bit network signalling word (which actually contains 16 bits of information). This network signalling word can be, for example, an EOM indicator. In the first frame (301), the next packet (305) comprises a 240 bit link control word (containing 60 bits of information), whereas the second frame (302) includes a third and fourth packet (307 and 308) representing, respectively, 112 bits of presentation address word data (representing 64 bits of information) and 288 bits of encryption synchronization information for use in encrypted signalling. Lastly, each frame (301 and 302) includes six voice packets (306), where each voice packet comprises a 208 bit packet of information representing 144 bits of VSELP information.

In this particular embodiment, the above totals to 3,360 bits for each superframe, representing 360 microseconds from a temporal standpoint.

Pursuant to this protocol, each voice packet (306) corresponds to a single discrete packet as provided by the encoding DSP (104). The contents of the signalling information are sourced and controlled by the host computer (102) associated therewith.

Figure 4:
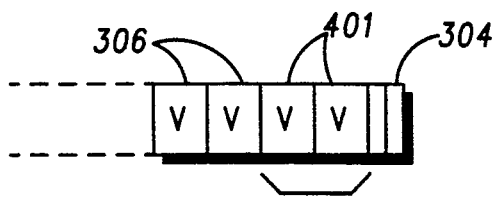
FIG. 4 comprises a portion of a superframe depicting in particular an end-of-message portion thereof.

Referring now to FIG. 4, at the conclusion of a message, a predetermined number of additional voice packets (401) will be transmitted, which additional packets represent silence when decoded pursuant to the methodology of choice. Subsequent to transmission of the at least predetermined number of additional packets (401), a disconnect signal will be transmitted in the appropriate network signalling word (304) location. Depending upon when a message concludes, there may or may not be sufficient additional voice packets (306) in a given frame (301 or 302) to accommodate the required number of additional packets (in this embodiment, two such packets must be sent). For example, if a message concludes, leaving four voice packets (306) available within a single frame (301 or 302), then all four frames will be transmitted with the silence information, thereby ensuring that the two required silence packets are transmitted, plus such additional packets as are required to complete the frame. By way of another example, if a message concludes and leaves only one voice packet (306) in a given frame (301 or 302), then that last packet will be sent with silence information, and an additional frame will be sent wherein all of the voice packets include the silence information. Following the additional frame, the disconnect signal will be transmitted.

Figure 5:
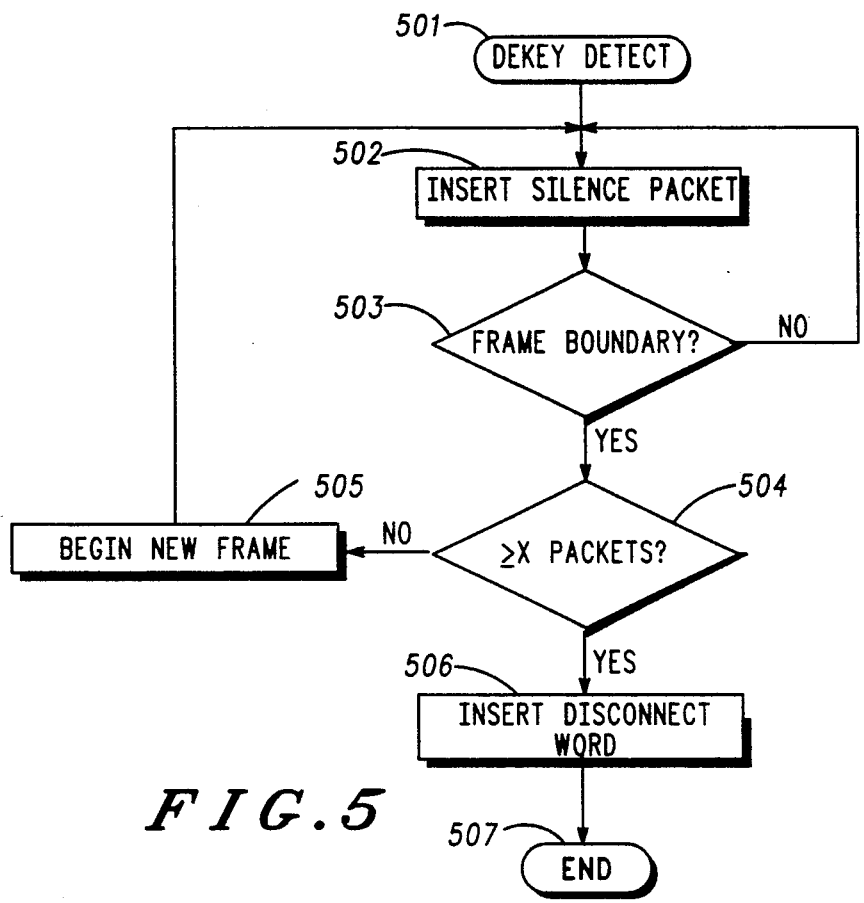
FIG. 5 comprises a flow diagram depicting operation of the transmitter in accordance with the invention.

Operation of the transmitter (100) will now be described with reference to FIG. 5. At such time as dekeying of the microphone is detected (501), the host computer instructs the DSP to insert a voice packet representing silence (502) following transmission of the true voice packets. The transmitter then determines whether a frame boundary has been encountered (503) (i.e., the transmitter determines whether the current frame (301 or 302) has been completed). If not, additional silence packets are inserted, until the frame boundary has been met.

Upon reaching the frame boundary, the process then determines whether at least a predetermined number of silence packets have been inserted pursuant to the above methodology (504). In this particular embodiment, at least two such packets must be so inserted. If not, a new frame is initiated (505), and the process continues by inserting silence packets into the new frame until the frame boundary has again been reached.

At such time as a sufficient number of silence packets have been inserted and transmitted, and the frame boundary has been met, an appropriate disconnect signal is inserted (506) as noted above, and the process concludes (507).

Figure 6:
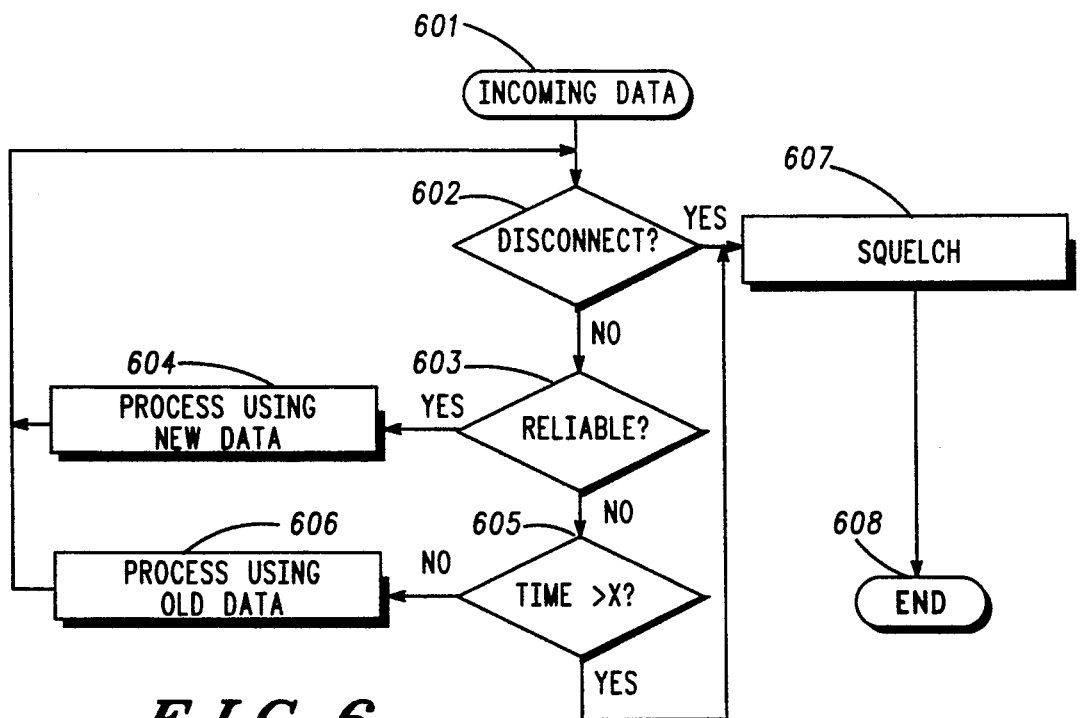
FIG. 6 comprises a flow diagram depicting operation of a receiver in accordance with the invention.

Operation of the receiver (200) will now be similarly described with reference to FIG. 6. In the presence of incoming data (601) the receiver monitors for the disconnect word (602). When it occurs, the receiver squelches (607) and the process concludes (608).

In the absence of the disconnect signal, however, the receiver ascertains whether incoming data appears to be reliable in accordance with any of a variety of well understood prior art techniques. So long as the information appears to be reliable, the new data is processed (604) and the process repeats as described above. (For example, so long as valid voice packets continue to be received, those new voice packets will be processed and the voice information rendered audible.)

If the incoming data should appear unreliable, however, the process determines whether a time out sequence has concluded (605) (which process can be initiated, for example, upon initially detecting unreliable data). So long as the time out sequence has not expired, the receiver will compensate by processing recently received old data (606) while continuing to monitor for incoming reliable data. Eventually, in the absence of reliable data, the time out sequence will expire, and the receiver will squelch (607) and conclude the process (608).

So configured, the transmitter, upon reaching the conclusion of a voice message, will intentionally and automatically transmit additional packets of information that represent silence. The receiver will, upon properly receiving and decoding these additional packets, will simply render audible these periods of intentional silence. If the disconnect word should be lost due to any of a variety of reasons, the receiver will continue to process the recently received information (which in this case will be the silence information) which reprocessing, in this particular instance, will not lead to the audible presentation of undesired sounds.

As noted above, in this particular embodiment, VSELP constitutes the encoding methodology of choice. Table 1 shown below constitutes the contents of a voice packet representing silence in this context. These values were selected by determining trends in the reflection coefficients and energy parameters following encoding of a series of psuedo-Guassian white noise samples at very low amplitude. Pursuant to this study, the applicants have determined that the energy parameter should be zero, thereby corresponding to the lowest possible energy level. The reflection coefficients (RC1-RC10) have been selected to reproduce a nearly flat (less than 1 dB ripple) spectrum. The GSPO codes have been chosen to minimize the corresponding gain factors. The code words are unspecified to enable DC balance for the frame (the bits shown in parentheses in the table are the code words used in a specific embodiment to DC balance the frame given a particular error correction code, the latter being not particularly relevant to this description). Lastly, the lag values were selected to represent the largest possible pitch period (approximately 60 Hz), as normal codec filtering will filter that component out.

It should also be noted that the 144th bit constitutes a soft interpolation bit. The latter should be set to 0 to minimize computational complexity at the receiver. Other values could be selected without necessarily effecting the result of silence, but it will require greater computational activity in order to arrive at this same result unless one follows the above.

With the above teachings in mind, the 144 bit voice packet frame will appear as follows (using hex characters and presuming no encryption): 14CF FCFF C7A5 6C65 80C2 9800 0181 0038 0400, wherein the bits at the beginning of the above representation constitute the first bits and wherein the trailing bits at the conclusion of the above representation represent the last bits.

TABLE 1

| parameter | bits | hex | binary |
|---|---|---|---|
| rc1 | 5 | 17 | 10111 |
| rc2 | 4 | 3 | 0011 |
| rc3 | 4 | A | 1010 |
| rc4 | 4 | 3 | 0011 |
| rc5 | 4 | 9 | 1001 |
| rc6 | 3 | 2 | 010 |
| rc7 | 3 | 4 | 100 |
| rc8 | 3 | 3 | 011 |
| rc9 | 2 | 2 | 10 |
| rc10 | 2 | 1 | 01 |
| energy | 5 | 0 | 00000 |
| lag 1 | 7 | 7F | 1111111 |
| gsp01 | 7 | 0 | 0000000 |
| code1 | 6 | | XXXXXX(=011000) |
| code_a1 | 6 | | XXXXXX(=010100) |
| lag2 | 7 | 7F | 1111111 |
| gsp02 | 7 | 0 | 0000000 |
| code2 | 6 | | XXXXXX(=000000) |
| code_a2 | 6 | | XXXXXX(=000000) |
| lag3 | 7 | 7F | 1111111 |
| gsp03 | 7 | 0 | 0000000 |
| code3 | 6 | | XXXXXX(=100000) |
| code_a3 | 6 | | XXXXXX(=000001) |
| lag4 | 7 | 7F | 1111111 |
| gsp04 | 7 | 0 | 0000000 |
| code4 | 6 | | XXXXXX(=001000) |
| code_a4 | 6 | | XXXXXX(=000000) |

Those skilled in the art will recognize that various modifications can be made to the above without departing from the inventive spirit. For example, in a particular application, something different than the silence described herein may be substituted, and yet acceptable results may be achieved. Therefore, as used herein, it should be understood that silence constitutes a somewhat relative and subjective element, and that certain audible sounds may be satisfactorily substituted for complete silence.

What is claimed is:

1. A method of transmitting an audible message in discrete packets, comprising the steps of:
   A) providing a message to be transmitted;
   B) packetizing the message in discrete packets;
   C) transmitting the discrete packets;
   D) for each and every audible message so transmitted, upon transmitting all of the discrete packets, automatically transmitting at least one additional packet representing silence.

2. The method of claim 1, and further including the step of:
   E) transmitting a disconnect signal.

3. The method of claim 1, wherein the step of transmitting the discrete packets includes the step of transmitting the discrete packets using a radio communication link.

4. The method of claim 1, wherein the step of providing a message to be transmitted includes the step of providing a voiced message.

5. The method of claim 1, wherein the step of transmitting the discrete packets includes the step of transmitting a plurality of the discrete packets in a data frame.

6. The method of claim 5, wherein the step of transmitting the discrete packets further includes the step of transmitting additional pluralities of the discrete packets in additional data frames.

7. A method of transmitting an audible message in discrete packets, comprising the steps of:
   A) providing a voiced message to be transmitted;
   B) digitizing the voiced message to provide a digitized voiced message;
   C) sampling and processing the digitized voiced message to provide a plurality of discrete packets;
   D) transmitting the discrete packets;
   E) for each and every voiced message so transmitted, upon concluding transmission of the discrete packets, automatically transmitting at least one additional packet representing silence.

8. The method of claim 7, wherein the step of sampling and processing the digitized voiced message to provide a plurality of discrete packets includes the step of processing the digitized voiced message pursuant to a particular encoding methodology.

9. The method of claim 8, wherein the step of transmitting at least one additional packet representing silence includes the step of providing at least one additional packet containing information that represents silence when decoded in accordance with the particular encoding methodology.

10. The method of claim 7, and further including the step of:
    F) transmitting a disconnect signal.

11. The method of claim 7, wherein the step of transmitting at least one additional packet representing silence includes the step of transmitting at least two additional packets representing silence.

12. The method of claim 7, wherein the step of transmitting the discrete packets includes the step of:
    D1) providing a frame protocol;
    D2) transmitting no more than a predetermined number of the discrete packets for each frame in the frame protocol.

13. The method of claim 12, wherein the step of transmitting at least one additional packet representing silence includes the step of transmitting at least a predetermined plurality of additional packets representing silence.

14. The method of claim 13, wherein the step of transmitting at least a predetermined plurality of additional packets representing silence includes the step of transmitting at least one additional frame in the frame protocol as necessary to accommodate transmission of the predetermined plurality of additional packets representing silence.

15. A radio, comprising:
    A) input means for receiving a voiced message to be transmitted;
    B) digitizing means operably coupled to the input means for digitizing the voiced message;
    C) processing means operably coupled to the digitizing means for sampling and processing the digitized voice message pursuant to a particular voice encoding methodology to provide a plurality of discrete packets;
    D) transmission means operably coupled to the processing means for transmitting the plurality of discrete packets;
    E) control means operably coupled to the input means, the processing means, and the transmission means, for sensing conclusion of the voiced message, and for each and every voiced message so transmitted, causing a predetermined number of additional discrete packets to be transmitted following conclusion of transmission of the plurality of discrete packets, which additional discrete packets represent silence.

16. The radio of claim 15, wherein the control means further functions to cause transmission of a disconnect signal following transmission of the additional discrete packets.

17. The radio of claim 15, wherein the additional discrete packets include at least one such additional discrete packet.

18. The radio of claim 16, wherein the additional discrete packets includes at least two such additional discrete packets.

* * * * *